United States Patent [19]

Hawkins et al.

[11] Patent Number: 5,055,164

[45] Date of Patent: Oct. 8, 1991

[54] ELECTRODEPOSITABLE PHOTORESISTS FOR MANUFACTURE OF HYBRID CIRCUIT BOARDS

[75] Inventors: Robert E. Hawkins, Upton; Richard Small, Marlborough; Alaric Naiman, Cambridge, all of Mass.

[73] Assignee: Shipley Company Inc., Newton, Mass.

[21] Appl. No.: 498,418

[22] Filed: Mar. 26, 1990

[51] Int. Cl.$^5$ ............................................. C23C 26/00
[52] U.S. Cl. ................................. 204/15; 204/180.2; 427/96; 427/98; 430/314
[58] Field of Search .................. 427/96, 98; 204/15, 204/180.2; 430/314

[56] References Cited

U.S. PATENT DOCUMENTS

| | | | |
|---|---|---|---|
| 3,666,549 | 5/1972 | Rhodenizer | 427/98 |
| 4,167,413 | 9/1979 | Christ et al. | |
| 4,321,285 | 3/1982 | Feldstein | 427/98 |
| 4,373,019 | 2/1983 | Watanabe | 427/96 |
| 4,412,377 | 11/1983 | Nagashima et al. | |
| 4,532,152 | 7/1985 | Elarde | 427/98 |
| 4,554,229 | 11/1985 | Small, Jr. | |
| 4,592,816 | 6/1986 | Emmons | 204/15 |
| 4,632,900 | 12/1986 | Demmer | 430/327 |
| 4,701,352 | 10/1987 | DeLuca | 427/98 |
| 4,746,399 | 5/1988 | Demmer | 427/96 |
| 4,751,172 | 6/1988 | Rodriguez | 430/314 |
| 4,756,756 | 7/1988 | Cassat | |
| 4,761,303 | 8/1988 | Ruszczyk | 427/96 |
| 4,845,012 | 7/1989 | Seko | 430/327 |
| 5,004,672 | 4/1991 | D'Ottavio | 427/98 |

*Primary Examiner*—Shrive Beck
*Assistant Examiner*—Vi Duong Dang
*Attorney, Agent, or Firm*—Robert L. Goldberg

[57] ABSTRACT

The disclosed invention relates to a method of manufacturing hybrid circuit boards which uses the step of electrodeposition of a photoresist composition onto said boards. This step represents improvements in the prior art use of dry film or other types of photoresists which did not conform to all three dimensional surfaces and which were not aqueous developable.

16 Claims, No Drawings

ELECTRODEPOSITABLE PHOTORESISTS FOR MANUFACTURE OF HYBRID CIRCUIT BOARDS

BACKGROUND OF THE INVENTION

1. Introduction

Hybrid circuit boards, including those with three-dimensional features, may be coated with photoresists during various stages of manufacture. The present invention discloses a means of applying an electrodepositable resist material of uniform thickness which gives a pinhole free coating that conforms to three-dimensional surfaces. Another advantage of this method is the elimination of hazardous solvent developers.

2. Discussion of the prior art

Hybrid circuits are circuits in which chip devices of various functions are electrically interconnected on an insulating substrate on which conductors or combinations of conductors and resistors have previously been deposited. Hybrid microcircuits are used in applications where high density, low volume, and low weight are required for an electronic system. Without these constraints, printed wiring boards with solder-attached, pre-packaged components are more economical. Because of the advantages of weight and volume which they have over printed wiring assemblies, hybrids have found extensive use in airborne and space applications. Other applications include communication systems, high-speed computers, guidance and control systems, radar systems, heart pacemakers, other medical electronic devices, and automotive electronics.

The resistors used in hybrid manufacture are batch processed therefore fewer interconnections need to be made. The reliability of hybrids over printed circuits may also be increased by various methods. Resistors can be trimmed statically or dynamically to precise values with close tracking; hence, precision circuits can be fabricated that are not possible with printed circuits. From a thermal management standpoint, hybrid circuits have the advantage of direct mounting of high-power devices on a thermally conductive ceramic which is greatly superior to mounting pre-packaged components onto a thermally-insulative epoxy or polyimide circuit board. To remove heat from a plastic printed circuit board, heavy metal heat rails must be attached with adhesive or metal-core boards must be used as substrates.

A detailed description of the processes for manufacturing hybrid circuit boards may be found in "Hybrid Microcircuit Technology Handbook—Materials, Processes, Design, Testing and Production", James J. Licari and Leonard R. Enlow, Chapters 2-7, pages 25–246, Noyes Publications (1988).

Substrates for hybrid board manufacture are usually ceramics made from alumina. The first step in the manufacturing process is the deposition of metals or metal compounds onto the substrate. These metals ultimately provide the conductor and resistor patterns and functions. Typically a substrate is coated sequentially with a layer of resistive material, a barrier metal, and a top layer of conductive metal all applied by vacuum evaporation, sputtering or some other method capable of depositing a thin coating on the order of 200 Angstroms to 20,000 Angstroms.

Use of photoresists in the manufacture of hybrid boards allows selected areas of a surface to be removed at various processing steps leaving other areas (protected by the photoresist) as defined patterns of metal conductors, resistors, dielectrics, or inorganic passivation layers. Photoresist materials used in fabrication of hybrid boards may be of two types: those that on exposure to light are cross-linked forming a hardened coating which is resistant to etchants and other solutions (negative) and those that on exposure to light are decomposed and can be dissolved selectively (positive). The photoresist coating is applied over the entire surface of the substrate, soft-baked to remove solvent, then exposed to ultraviolet light through a mask.

Liquid photoresists are generally applied to substrates as a single unitary coating by spraying, dipping, spin coating or roller coating. Resultant coatings may show variations in thickness due to build-up at the outer edges. Any blemishes, pinholes or other imperfections in the hardened resist become sites for the penetration of etchants or plating solutions, resulting in opens or shorts in the circuitry.

For three-dimensional boards, there is the added problem of obtaining a uniform coating particularly at holes and corners, which leads to different exposure and developing times and often results in defective products. Another type of photoresist sometime used is referred to as dry film. While dry film resists have been used in the preparation of two-dimensional boards, they do not lend themselves to application in three-dimensional systems because dry film is generally applied using heat and pressure with pinch rollers that do not readily conform to three-dimensional features.

The photoresist that remains on the substrate must also provide good adhesion qualities and be able to withstand subsequent fabrication steps such as electrolytic plating with metals such as copper, nickel or gold.

U.S. Pat. No. 4,167,413 discloses a method of making hybrid integrated circuits with photoresist laminate. The process involves use of a preformed piece of dry film photoresist which is laminated to the substrate by simultaneously applying pressure and heat. This method provides no protection for the edges and requires an additional step of painting a layer of liquid resist around the edges where the coating need not be uniform. Such a process would not be suitable for use with three-dimensional substrates.

U.S. Pat. No. 4,412,377 discloses a method of making hybrid integrated circuits with photoresists using a typical printing process. The resist is printed on the ceramic substrate in the desired pattern and dried at about 125° C. The resist layer is subsequently removed using trichloroethylene solvent. This solvent must be used with adequate ventilation and may have health and environmental effects. Again, such a process is not applicable to three-dimensional substrates.

U.S. Pat. No. 4,554,229 discloses a method of making multilayer hybrid integrated circuits using a dry film photoresist that is removed using methylene chloride.

U.S. Pat. No. 4,756,756 describes a method of forming thick-layer, hybrid electronic printed circuits in which a negative photoresist is deposited uniformly over the surface by spraying. The image-wise exposed resist is subsequently removed using pure xylene.

It is an object of the present invention to provide a means of manufacturing an improved hybrid integrated circuit using photoresist materials which may be applied by a method applicable to all geometries of substrates. The applied resist is preferably aqueous developable and strippable providing for improved environmental handling.

SUMMARY OF THE INVENTION

The present invention relates to a method for electrodepositing photoresist compositions onto hybrid circuit boards. The geometry of the board is not controlling and a uniform coating is obtained over all surfaces. After exposure, the photoresist is easily removed using aqueous developable and strippable solvents.

In one preferred process of the invention, the ceramic substrate which has been previously coated with thin layers of metals (now a conductive substrate) is then coated with a photoresist composition by electrodeposition. The thus obtained coating is uniform, pinhole free and conforms to all three-dimensional surfaces. The resist also has the advantage of being aqueous developable and strippable.

DESCRIPTION OF THE PREFERRED EMBODIMENTS

This invention describes a process for formation of hybrid circuit boards using a step of electrodeposition of a photoresist coating during fabrication of said boards. Hybrid circuit board substrates are usually ceramic in nature and may be made with alumina or beryllia, depending upon the thermal conductivity characteristics desired. Other possible substrates include aluminum nitride, silicon nitride, boron nitride, silicon, silicon carbide, enameled metal substrates (porcelainized) or mixtures of any of the above listed compounds. The preferred substrate is an alumina based ceramic. Thickness of the substrate is usually in the range of 25–30 mils.

The first step in fabrication of thin film microcircuits involves deposition of several metallic layers such as a resistive layer, a barrier layer and a conductive layer to be applied sequentially. The thickness of the coating is usually in the range of 200 Angstroms to 20,000 Angstroms and is achieved by use of methods such as vapor deposition, direct current sputtering, radio-frequency sputtering, or reactive sputtering. The preferred method for thin films is sputtering. Sputtered films adhere more strongly to substrates than vapor deposited films and are more uniform. Both conductive (metals, alloys) and non-conductive (dielectrics, insulators) may be applied using this technique. The choice of resistor metals or materials include nickel chrome alloy (nichrome), tantalum nitride, chromium-silicon oxide (cermet), and titanium. The barrier layer is usually nickel, palladium or similar metals. The choice of barrier layer should be such that during annealing conditions, which may reach 450–500° C., there is no diffusion between the resistive layer and the conductive layer. The conductive layer may be metals which include gold, copper or silver.

Application of photosensitive resists material is the next step in fabrication. Typical electrodepositable photoresists coating compositions are described in U.S. Pat. Nos. 4,592,816, 4,845,012 and 4,632,900, incorporated herein by reference. The coating compositions may be positive or negative acting. The negative acting resists are mixtures which are initially soluble in developer but after light exposure, become polymerized and insoluble in developer. Positive acting resists are mixtures which are initially insoluble in developer but after exposure to a source of radiation become soluble in developer.

During electrodeposition of photoresists material, the conductive substrate acts as an electrode and the process may be cathodic or anodic. If the polymer portion of the resist contains positively charged carrier groups, the coating is deposited cataphoretically by applying a negative charge to the substrate. Such carrier groups include for example, quaternary ammonium groups and phosphonium groups. Other groups which become positively charged upon reaction with an acid, such as for example amine groups, may also be used. Acids that are useful to protonate the carrier groups of the polymers include lactic acid, glycolic acid, hydroxyacetic acid, hydrochloric acid, formic acid, acetic acid and phosphoric acid.

Polymers having negatively charged carrier groups will deposit on a positively charged substrate anaphoretically. Carboxylic acid groups are suitable negatively charged carrier groups.

Exposure may be achieved by methods well known in the art and described in Eliot, "Integrated Circuit Fabrication Technology", Chapter 8, pages 165–202, McGraw-Hill (1982), incorporated herein by reference. After exposure, the negative acting resists material in the unexposed area is removed, by contact with developer, leaving the desired pattern on the substrate. Positive acting resists work in the opposite manner. Exposure to light causes the photoresists to become soluble in the developer, and the exposed area is removed by subsequent development.

The thus formed hybrid circuit is then ready for subsequent conventional steps such as electrolytic plating, stripping and etching.

Multilayer hydrid integrated circuits may be manufactured by the method disclosed in U.S. Pat. No. 4,554,229, incorporated herein by reference. In this procedure, the electrodepositable photoresists would be applied after the metallized pattern has been formed on the ceramic substrate. A blanket metallized layer may also be applied over the metallized pattern prior to applying the photoresists.

Thick film hybrid integrated circuits may be manufactured by the method disclosed in U.S. Pat. No. 4,756,756, incorporated herein by reference. In this procedure, the uniformly deposited and baked layer of screened ink would be made conductive by sputter coating or vacuum depositing a metal prior to electrodeposition of a photoresists coating.

It should be appreciated that many variations of processes can be used for preparing hybrid integrated circuit devices that would employ use of an electrodepositable photoresists formulation. The following descriptions should be taken as examples of processes in which the invention may be used while those skilled in the art would appreciate other variations in which the principles of the invention would apply.

EXAMPLE I

A preformed ceramic substrate is used that has been sputter metallized to form a very thin base metal layer thereon. A photoresist composition, such as that of Example 1 described in U S. Pat. No. 4,592,816, is applied by electrodeposition. The conducting substrate is placed in the electrodeposition bath which contains anodes. Negative current is then applied to the substrate and the positive micelles of the photoresist bath are deposited on the surface of the substrate. The temperature of the bath is 50° C. with an applied voltage of 60 volts for a period of 10 seconds. The thus deposited photoresists is then image-wise exposed to form the desired conductor pattern thereon using an aqueous developer such as a 1% solution of lactic acid containing 1–2% of a surfactant such as Triton X 100. The exposed metallized layer is then electroplated using conventional electroplating baths containing metals such as copper followed by nickel and/or gold. The photoresist is stripped from the surface by an aqueous solution of 30% lactic acid containing 1–3% of a surfactant such as Triton X 100; and the substrate etched so as to remove the initially applied sputtered layer.

EXAMPLE II

A typical ceramic substrate is screen printed with a desired metallic pattern, dried at 120° C. for 10 minutes and fired at 850° C. A layer of patterned dielectric is then screened on, dried and fired as above. Blanket layers of metal are then sputtered on in the order of resistive layer, barrier layer and conductive layer. A typical resistive layer, which serves to promote adhesion, is titanium. The barrier layer, which prevents interdiffusion between the conductive layer and resistive layer, is a metal such as palladium. The top conductive layer is a metal such as gold. The electrodepositable photoresists is then applied to the thus formed conductive substrate, image-wise exposed and developed as described above in Example I. Conductive layers of copper, nickel and gold are then electrolytically applied; photoresists stripped using an aqueous solution of lactic acid; and the blanket layers etched to expose the desired portions of the original metallic pattern.

EXAMPLE III

A typical ceramic substrate is covered with a potentially conducting ink by knife coating. After drying and baking for 1 hour at 160° C., the resulting deposit is made conductive by sputter coating a layer or layers of metals prior to electrodepositing a photoresist coating over the entire surface. After drying, the layer of photoresist is image-wise exposed and developed to remove the portions of photoresist soluble in the developer. The zones which are to be conductive thus appear at the locations where dissolutions was effected. The thin sputtered layer(s) of metals are etched and the potentially conducting zones of the substrate are reduced using sodium borohydride in aqueous solution. Finally, the remaining photoresist is totally removed by stripping and the zones then appearing are insulating.

What is claimed is:

1. A method for forming a hybrid circuit board comprising:
   a. providing a three-dimensional featured ceramic substrate having sequentially applied thereon, a resistive layer, a diffusion barrier layer and a metallic conductive layer thereby forming a conductive coating;
   b. electrodepositing a photoresist on said conductive coating;
   c. imaging said photoresist whereby portions of said conductive coating are exposed;
   d. plating said exposed portions of the conductive coating with a conductive metal;
   e. stripping said imaged photoresist whereby a stripped surface of said metallic conductive layer is exposed; and
   f. etching said stripped surface thereby exposing said three-dimensional featured ceramic substrate.

2. The method of claim 1 wherein said ceramic substrate is selected from the group consisting of alumina, beryllia, aluminun nitride, silicon nitride, boron nitride, silicon, silicon carbide, enameled metal or mixtures thereof.

3. The method of claim 1 wherein said ceramic substrate is an alunina based ceramic.

4. The method of claim 1 whrein said resistive layer is selected from the group consisting of nickel chrome alloy, tantalum nitride, chromium-silicon oxide or titanium.

5. The method of claim 1 wherein said resistive layer is titanium.

6. The method of claim 1 wherein said diffusion barrier layer is selected from the group consisting of nickel or palladium.

7. The method of claim 1 wherein said diffusion barrier layer is nickel.

8. The method of claim 1 wherein said metallic conductive layer is selected from the group consisting of gold, copper, nickel, or silver.

9. The method of claim 1 wherein said metallic conductive layer is copper.

10. The method of claim 1 wherein said imaging step further comprises the steps of imagewise exposing and developing.

11. The method of claim 10 wherein said developing step utilizes an aqueous developer.

12. The method of claim 1 wherein said plating is done electrolessly.

13. The method of claim 1 wherein said plating is done electrolytically.

14. The method of claim 1 wherein said conductive metal is copper.

15. The method of claim 1 wherein said conductive metal is gold.

16. The method of claim 1 wherein said stripping step utilizes an aqueous stripper.

* * * * *